United States Patent
Dawson et al.

[11] Patent Number: 5,949,126
[45] Date of Patent: Sep. 7, 1999

[54] TRENCH ISOLATION STRUCTURE EMPLOYING PROTECTIVE SIDEWALL SPACERS UPON EXPOSED SURFACES OF THE ISOLATION TRENCH

[75] Inventors: Robert Dawson; Fred N. Hause; Charles E. May, all of Austin, Tex.

[73] Assignee: Advanced Micro Devices, Inc.

[21] Appl. No.: 08/992,735

[22] Filed: Dec. 17, 1997

[51] Int. Cl.[6] .............................. H01L 29/00; H01L 29/76
[52] U.S. Cl. .......................... 257/513; 257/506; 257/510; 257/396
[58] Field of Search ...................... 257/510, 513, 257/504, 396, 397, 408, 622, 301; 438/227, 424, 425, 426, 595, 576, 303

[56] References Cited

U.S. PATENT DOCUMENTS 5,780,348   7/1998   Lin et al. ................................. 438/303

FOREIGN PATENT DOCUMENTS 402113548   4/1990   Japan .

*Primary Examiner*—Minh Loan Tran
*Assistant Examiner*—Hung Kim Vu

*Attorney, Agent, or Firm*—Kevin L. Daffer; Conley, Rose & Tayon

[57] ABSTRACT

A shallow trench isolation structure and method for making the same are presented. In an embodiment, a trench dielectric is formed within a shallow trench that is disposed in a semiconductor substrate comprising single-crystalline silicon. Dielectric spacers are formed upon the opposed sidewall surfaces of a gate conductor arranged upon the semiconductor substrate a spaced distance from the trench dielectric. Formation of these dielectric spacers involves depositing a dielectric material across the semiconductor topography and anisotropically etching the dielectric material from horizontal surfaces more quickly than from the vertical sidewall surfaces of the gate conductor. Etch duration is terminated after a pre-defined lateral thickness of the dielectric material is achieved upon the sidewall surfaces of the gate conductor. The upper surface of the trench dielectric is also attacked by etchants during the formation of the dielectric spacers. The resulting upper surface of the trench dielectric is recessed below the upper surface of the semiconductor substrate. Protective spacers are subsequently formed upon exposed portions of the trench sidewalls between the upper surface of the substrate and the upper surface of the trench dielectric. These protective spacers inhibit silicide formation upon the trench sidewalls during subsequent formation of silicide upon source/drain junctions of the substrate directly adjacent the trench sidewalls.

6 Claims, 4 Drawing Sheets

TRENCH ISOLATION STRUCTURE EMPLOYING PROTECTIVE SIDEWALL SPACERS UPON EXPOSED SURFACES OF THE ISOLATION TRENCH

BACKGROUND OF THE INVENTION

1. Field of the Invention

This invention relates to integrated circuit fabrication and, more particularly, to a shallow trench isolation structure and method for forming the same in which protective sidewall spacers are strategically formed upon the exposed sidewall surfaces of the shallow trench proximal to the upper surface of the semiconductor surface.

2. Description of Relevant Art

The fabrication of an integrated circuit involves placing numerous devices in a single semiconductor substrate. Isolation structures are needed to electrically isolate one device from another. Isolation structures define the field regions of the semiconductor substrate while the device areas define the active regions (or mesa regions). The devices are interconnected with metal conductors disposed across an interlevel dielectric arranged above the devices and the semiconductor substrate. Low resistance contacts extending through the interlevel dielectric from the conductors to the active regions serve to couple these two levels of the integrated circuit together.

A popular isolation technology used in integrated circuits involves the process of locally oxidizing silicon. Local oxidation of silicon, i.e., "LOCOS", involves oxidizing those field regions of the semiconductor substrate interposed between active regions. The silicon dioxide ("oxide") grown in field regions is termed "field oxide". Field oxide is typically grown during the initial stages of integrated circuit fabrication before source and drain implants are forwarded into active regions. By growing a relatively thick field oxide in the field regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends entirely across the field region and can unacceptably laterally encroach into the device active region as a bird's-beak structure. Second, the pre-implanted channel-stop dopant often redistributes during the high temperatures associated with field oxide growth. Redistribution of channel-stop dopant primarily affects the active region periphery, causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as "shallow trench isolation". Despite advances made to decrease bird's-beak encroachment, channel-stop migration, and non-planarity, it appears that LOCOS technology is still inadequate for deep submicron technologies. The shallow trench isolation process is better suited for isolating densely spaced active devices having field regions less than, e.g., 3.0–5.0 microns in the lateral dimension. The trench isolation process involves the steps of etching a silicon substrate surface to a relatively shallow depth, e.g., between 0.2 to 0.5 microns, and then filling the shallow trench with a deposited dielectric (referred to henceforth as "trench dielectric"). Some trench isolation processes include an interim step of growing oxide on trench walls prior to the trench being filled. After the trench is filled, it is then planarized to complete the isolation structure. The trench process, inter alia, eliminates bird's-beak and channel-stop dopant redistribution problems.

Chemical-mechanical polishing ("CMP") is a technique currently used in the industry to planarize dielectric layers and, more specifically, trench dielectrics. CMP combines a mechanical polishing pad with a chemical slurry to remove dielectric material. CMP is typically a "dirty" procedure in that polishing-slurry particles and other residues accumulate upon the surface of the semiconductor topography during CMP. These contaminants must be cleaned from the semiconductor topography after the CMP process is complete. An RCA cleaning method may be used to clean the upper surface of the semiconductor topography. RCA cleaning first involves removal of organic film contamination followed by the application of an inorganic ion and heavy metal cleaning step. The RCA cleaning method acts upon and slightly removes the trench dielectric upper surface to a greater degree than adjacent silicon.

Subsequent processing steps may eventually lead to the upper surface of the trench dielectric being significantly displaced below the surface of the semiconductor substrate. In particular, the trench dielectric may undergo etching during the formation of dielectric spacers laterally adjacent to opposed sidewall surfaces of a polycrystalline silicon ("polysilicon") gate conductor arranged upon the substrate laterally spaced from the trench dielectric. The dielectric spacers are typically formed using an anisotropic etch in which ion bombardment occurs more frequently upon horizontal surfaces than vertical surfaces of a dielectric material deposited across the gate conductor, the substrate, and the trench dielectric. The duration of the etch process is terminated when the dielectric material has been removed from all surfaces except the sidewall surfaces of the gate conductor. Unfortunately, in order to achieve the desired lateral thickness of the dielectric spacers, the exposed horizontal surface of the trench dielectric must undergo substantial ion ablation before the etch process can be terminated. Furthermore, the surface of the trench dielectric may also be lowered as a result of exposure to subsequent cleaning processes using, e.g., an HF based solution.

Lowering the upper surface of the trench dielectric below the upper surface of the semiconductor substrate can, unfortunately, present many problems. After dopants have been implanted into source/drain junctions of the active regions between the gate conductor and adjacent trench dielectric structures, highly conductive ohmic contacts must be formed between the source/drain junctions and overlying interconnect. A self-aligned silicide ("salicide") is typically formed at the juncture between the ohmic contacts and the junctions. Salicide formation involves deposition of a refractory metal across the semiconductor topography followed by heating the refractory metal so as to cause the metal to react with underlying silicon. The resulting salicide is thus exclusively present upon regions of the semiconductor topography heavily concentrated with silicon, e.g., the source/drain junctions. If a trench dielectric is recessed below adjacent source/drain junctions such that sidewalls of the silicon-based substrate are exposed, silicide formation may occur upon those exposed sidewalls. Consequently, the relatively low resistivity silicide can undesirably form a conductive pathway between the source/drain junctions and the oppositely doped underlying semiconductor substrate. Thus, when attempting to produce a drive current between the source and drain junctions by applying voltages to the gate and to one of the transistors, the majority charge carriers may be drawn away from rather than toward the channel region of the transistor. As a result, current flow from the source to the drain may be minimal, leading to inoperability of the transistor.

It would therefore be beneficial to form a trench dielectric and adjacent transistors in a manner that inhibits bridging between source/drain junctions and an underlying semiconductor substrate. The presence of silicide upon the sidewalls of an isolation trench proximate the surfaces of adjacent source/drain junctions can create a conductive path between the junctions and the bulk substrate, leading to inoperability of the transistor employing the junction. It is therefore necessary to prevent silicide formation upon the sidewalls of an isolation trench in close proximity to the surfaces of adjacent active regions while forming silicide upon the upper surfaces of source/drain transistor junctions.

SUMMARY OF THE INVENTION

The problems identified above are in large part addressed by the technique hereof for forming a trench isolation structure comprising protective dielectric spacers arranged upon the opposed trench sidewalls directly above the trench dielectric surface and laterally adjacent to source/drain junctions. The trench dielectric has been removed to a level spaced below the surface of a semiconductor substrate as a result of various semiconductor processing steps. The presence of the dielectric spacers upon the trench sidewalls advantageously prevents a subsequently deposited refractory metal from contacting the trench sidewalls. The dielectric spacers passivate the trench sidewalls while the refractory metal is heated to form silicide upon exposed silicon surfaces. Since silicide is produced from the reaction between silicon and metal, and the metal is inhibited from contacting silicon at the trench sidewalls, silicide formation upon the trench sidewalls is substantially prevented. Dielectric spacers configured upon the otherwise exposed isolation trench sidewalls thus reduces the possibility of an electrical short forming between the source/drain junctions adjacent the trench isolation structure and the underlying substrate.

In a preferred embodiment, a semiconductor substrate comprising lightly doped n-type or p-type single crystalline silicon with a resistivity of approximately 12 ohms-cm is provided. A relatively thin pad oxide layer is thermally grown across the semiconductor substrate to a thickness of approximately 50 to 500 angstroms. A silicon nitride ("nitride") layer is then deposited across the pad oxide to a thickness of approximately 500 to 1700 angstroms using, e.g., LPCVD of nitride. Portions of the nitride layer, the pad oxide, and the semiconductor substrate are then sequentially etched to form a relatively shallow trench within the substrate. A relatively thin oxide layer is thermally grown upon the exposed surfaces of the trench. The nitride layer substantially prevents oxide growth upon the substrate surface. The nitride layer may then be removed using, e.g., a selective wet etch. A trench dielectric, preferably oxide is CVD deposited into the trench to a level above the semiconductor substrate. The trench dielectric and pad oxide are then removed, preferably using a CMP process, down to a level commensurate with the upper surface of the substrate. Subsequently, the entire upper surface of the dielectric is cleaned using an RCA cleaning method to chemically remove film contaminants. The RCA cleaning method partially attacks the fill dielectric upper surface; however, it is a subsequent spacer etch that more substantially reduces the fill dielectric surface relative to the substrate surface immediately adjacent the fill dielectric.

A transistor may be formed upon and within the substrate laterally adjacent to the trench dielectric by first depositing a polysilicon layer across the substrate and trench dielectric. Portions of the polysilicon layer are etched away to define a gate conductor interposed between a pair of opposed sidewall surfaces. A lightly doped drain ("LDD") self-aligned to the sidewall surfaces of the gate conductor is then forwarded into junction regions of the semiconductor substrate. A spacer dielectric, preferably oxide, is CVD deposited across the exposed surfaces of the substrate, the trench dielectric, and the gate conductor. The spacer oxide is anisotropically etched until a pre-defined thickness of the oxide is retained exclusively upon the sidewall surfaces of the gate conductor, thereby forming sidewall spacers. During the anisotropic step which is highly selective to oxide, ion ablation of the surface of the trench dielectric (which may comprise oxide) occurs, causing the trench dielectric to be displaced below the substrate surface. As a result, the sidewalls of the isolation trench become exposed. Source/drain impurities self-aligned to the exposed lateral edges of the sidewall spacers are then introduced into the junction regions.

Another spacer dielectric is then deposited across the exposed surfaces of the semiconductor topography. The spacer dielectric is anisotropically etched for a duration required to form dielectric spacers exclusively upon the exposed sidewalls of the isolation trench directly above the surface of the trench dielectric. A layer of refractory metal is then deposited across the semiconductor topography. The metal may be chosen from a group of metals consisting of titanium, platinum, cobalt, molybdenum, tantalum, and tungsten. The metal is heated to initiate reaction between the metal and immediately adjacent silicon, and thereby form silicide upon the source/drain junctions and the gate conductor of the transistor. Due to the existence of the protective dielectric spacers upon the trench sidewalls, contact between the refractory metal and silicon along the trench sidewalls is inhibited. Thus, silicide formation upon the trench sidewalls is substantially prevented by the presence of the dielectric spacers.

BRIEF DESCRIPTION OF THE DRAWINGS

Other objects and advantages of the invention will become apparent upon reading the following detailed description and upon reference to the accompanying drawings in which.

Figure 1:
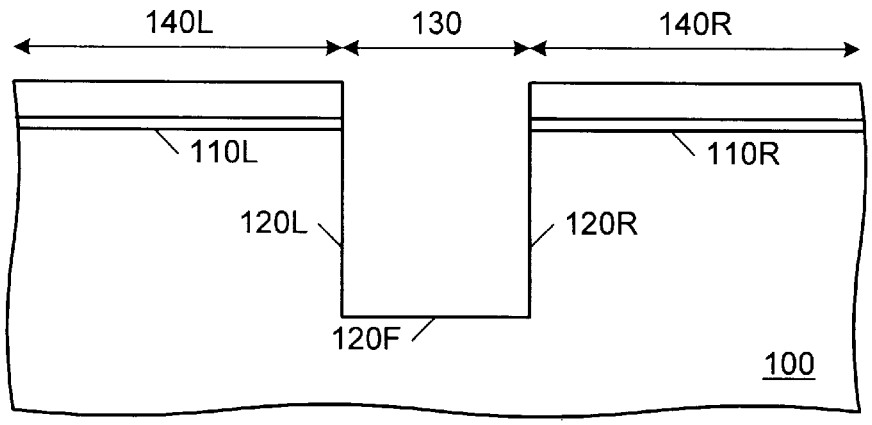
FIG. 1 is a partial cross-sectional view of a semiconductor topography in which a shallow trench is formed in a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but, on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1 shows semiconductor substrate 100. Semiconductor substrate 100 comprises active regions 140L and 140R and field region 130. Semiconductor substrate 100 may further comprise lightly doped n-type or p-type single-crystalline silicon having a resistivity of approximately 12 $\Omega$-cm. A thermally grown pad oxide 102 is arranged upon the surface of semiconductor substrate 100, and a CVD deposited nitride layer is disposed across pad oxide 102. Pad oxide 102 serves to suppress the stresses inherent between nitride and silicon. Portions of nitride layer 104, pad oxide 102, and substrate 100 are removed to form a relatively shallow trench in semiconductor substrate 100. Removal of those portions involves patterning a photoresist masking layer upon the surface of nitride layer 104 using optical lithography, so as to expose a portion of nitride layer 104. An etch technique, e.g., an anisotropic plasma etch process is then performed to etch unmasked portions of nitride layer 104, pad oxide 102, and substrate 100 in sequence. In an embodiment, a chlorinated plasma, or a chloro-fluoro carbon bearing plasma can be used to achieve the desired selectivity with respect to the patterned photoresist. The etch process defines trench sidewalls 120L and 120R and trench floor 120F.

Figure 2:
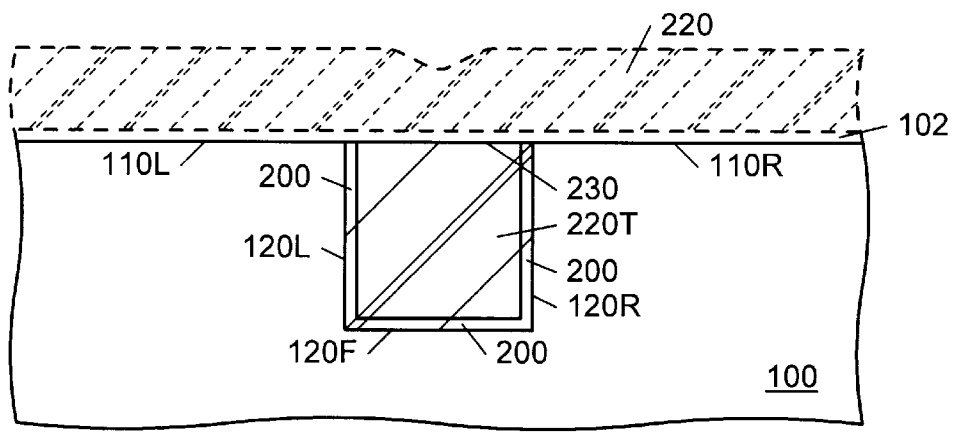
FIG. 2 is a partial cross-sectional view of a semiconductor topography according to a processing step subsequent to FIG. 1 in which a trench dielectric is deposited over the entire substrate region and subsequently planarized.

Turning to FIG. 2, a trench liner dielectric 200 is formed upon trench sidewalls 120L and 120R and trench floor 120F. The formation of trench dielectric 200 may be achieved with a thermal oxidation furnace using temperatures of approximately 700°–1050° C. or, alternatively, in a rapid thermal anneal apparatus in which semiconductor substrate 100 is subjected to a temperature of approximately 700°–1150° C. for a relatively short duration (i.e., less than a few minutes) while in the presence of an oxygen bearing ambient. Nitride layer 104 serves to prevent substrate surfaces 110L and 110R from being exposed to the oxygen bearing ambient used for the oxidation of trench sidewalls 120L and 120R and trench floor 120F. Nitride layer 104 is then removed using, e.g., a wet etch technique highly selective to nitride, or a dry plasma etch chosen to terminate once nitride layer 104 has been completely etched away. A dielectric material 220 is then deposited over the semiconductor substrate so as to completely fill the shallow trench. In a presently preferred embodiment, dielectric layer 220 is CVD deposited formed from a TEOS source. Dielectric layer 220 and pad oxide 102 are then removed to a level commensurate with the upper surface of substrate 100 using, e.g., a CMP process. The upper surface 230 of the resulting trench dielectric 220T arranged within the isolation trench is at approximately the same level as upper surfaces 110L and 110R of semiconductor substrate 100. CMP combines a mechanical polishing pad with a chemical solution to remove dielectric material and is typically a "dirty" procedure, for the polishing-slurry particles and other residues must be cleaned after the CMP planarization.

Figure 3:
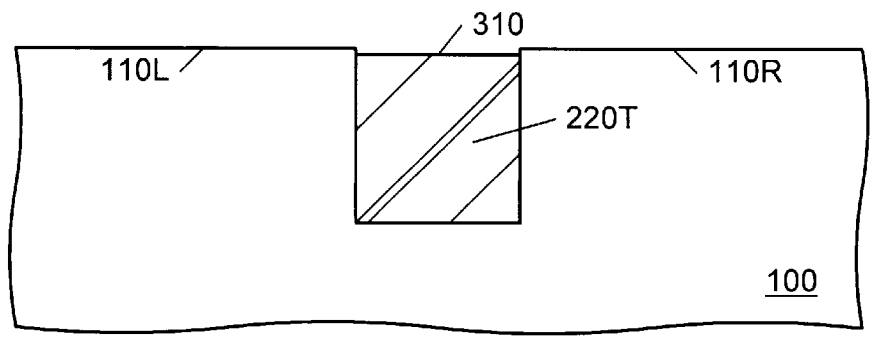
FIG. 3 is a partial cross-sectional view of a semiconductor topography according to a processing step subsequent to FIG. 2 in which the upper surface of the entire semiconductor substrate is cleaned.

As shown in FIG. 3, upper surfaces 110L and 110R of substrate 100 and surface 310 of trench dielectric 220T may be subsequently cleaned using an RCA cleaning method. An RCA cleaning method may comprise: (1) immersion into a sulfuric acid-oxidant mixture ($H_2SO_4$—$H_2O_2$) followed by a rinse using deionized and filtered water ("DI water") having a resistivity of 10–18 M$\Omega$-cm; (2) removal of residual organic contaminants and certain metals with a fresh mixture of $H_2O$—$NH_4OH$—$H_2O_2$ (5:1:1 by volume) which is prepared and heated to 75°–80° C. by submerging into the mixture for 10–15 minutes, and then rinsing in DI water for one minute; (3) stripping any hydrous oxide formed during step 2 by submerging for 15 seconds in a mixture of HF—$H_2O$ (1:10 by volume) and rinsing for about 20–30 seconds; (4) removing remaining atomic and ionic contaminants with a fresh mixture of $H_2O$—HCl—$H_2O_2$ (6:1:1 by volume) which is prepared and heated to 75°–80° C. by submerging for 10–15 minutes, and then rinsing in DI water. As a result of the cleaning process, upper surface 310 of trench dielectric 220T may be slightly removed below upper surface 110 of semiconductor substrate 100. Semiconductor substrate 100 is more resistant to the chemicals used during the RCA clean as compared to trench dielectric 220T.

Figure 4:
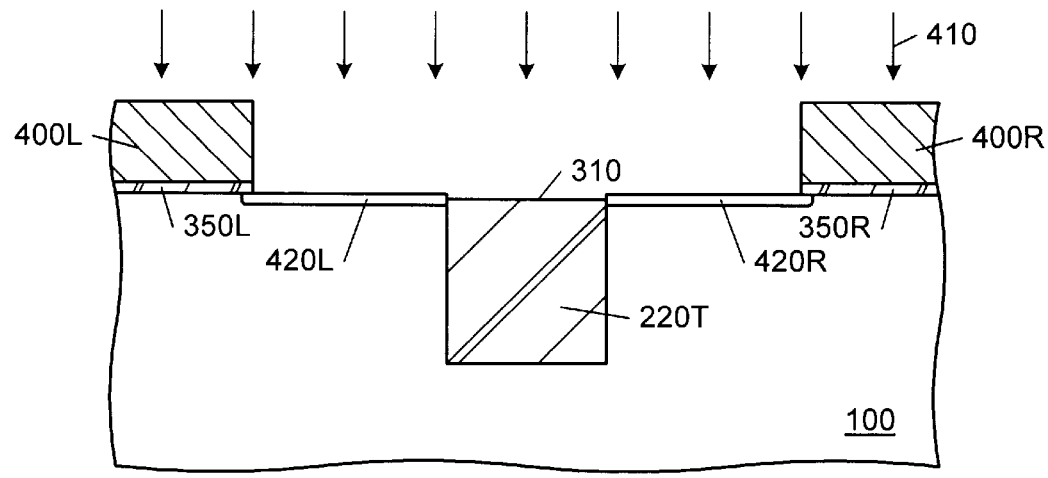
FIG. 4 is a partial cross-sectional view of a semiconductor topography according to a processing step subsequent to FIG. 3 in which a portion of a transistor is formed in the active region of the semiconductor substrate.

Turning now to FIG. 4, gate conductors 400L and 400R are shown as being dielectrically spaced above semiconductor substrate 100 by respective gate dielectrics 350L and 350R. Gate conductors 400L and 400R are laterally spaced from trench dielectric 220T in opposite directions from the trench dielectric. The gate dielectrics and gate conductors may be formed by first thermally growing a gate oxide across substrate and CVD depositing a polysilicon layer across the gate oxide. Then portions of the polysilicon layer and gate oxide are sequentially etched away using, e.g., a plasma etch technique to define gate conductors 400L and 400R and gate dielectrics 350L and 350R. In a preferred embodiment, conductive gate structures 400L and 400R comprise amorphous polysilicon. The sheet resistivity of conductive gate structures 400L and 400R is preferably reduced by introducing impurities into gate conductors 400L and 400R. The introduction of impurities into gate conductors 400L and 400R can be accomplished in situ during polysilicon deposition, or post-deposition in a diffusion tube or with an ion implantation process. In an embodiment in which it is desired to produce n-channel (NMOS) transistors, phosphorus or arsenic impurities are introduced into gate conductors 400L and 400R while, in a p-channel (PMOS) embodiment, a boron impurity is preferably used. It is preferable to introduce sufficient impurities so as to reduce the sheet resistivity of gate conductors 400L and 400R. A light concentration of impurities 410 self-aligned to the opposed sidewall surfaces of gate conductors 400L and 400R is then introduced into LDD areas 420L and 420R.

Figure 5:
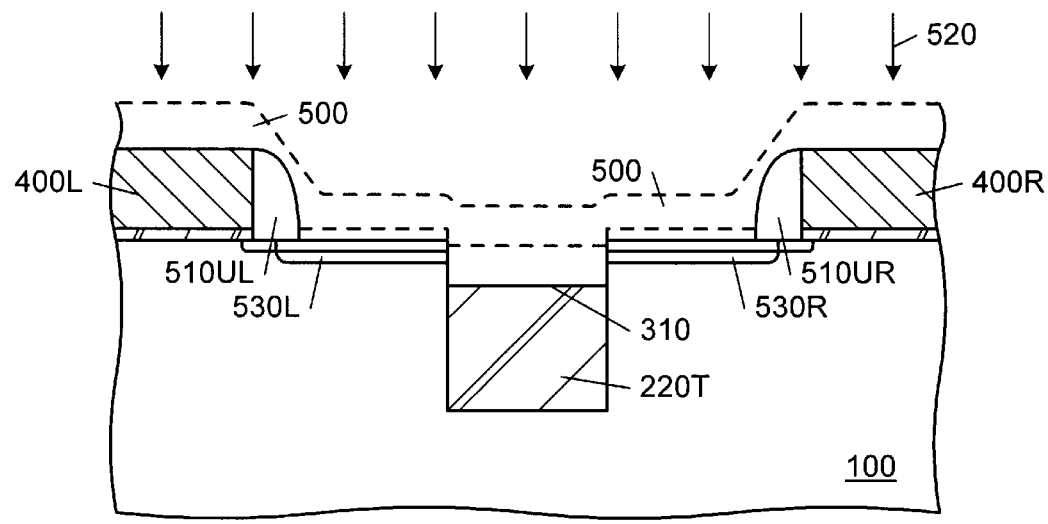
FIG. 5 is a partial cross-sectional view of a semiconductor topography according to a processing step subsequent to FIG. 4 in which sidewall spacers are formed upon opposed sidewall surfaces of the transistor gate conductor by anisotropically etching a dielectric material deposited across the topography, resulting in the trench dielectric surface is being etched to a level substantially below the substrate surface.

Turning now to FIG. 5, a conformal dielectric layer 500 is deposited across the exposed surfaces of the semiconductor topography. Conformal dielectric layer 500 preferably comprises a CVD deposited oxide. By using an anisotropic etch process, conformal dielectric layer 500 is removed primarily from horizontal surfaces. The duration of the anisotropic etch is chosen to terminate before a pre-defined lateral thickness of the dielectric layer is removed from the sidewall surfaces of gate conductors 400L and 400R. As a result, sidewall spacers 51 OUL and 51 OUR are formed upon the exposed sidewall surfaces of gate conductors 400L and 400R. All of the dielectric layer 500 disposed above trench dielectric 200T is removed before termination of the etch process. Unfortunately, during the anisotropic etch process the upper surface 310 of trench dielectric 200T is also attacked, leading to the displacement of surface 310 substantially below the surface of substrate 100. The anisotropic etch process higher selectivity to dielectric layer 550 and trench dielectric 200T relative to semiconductor substrate 100. Following the formation of sidewall spacers 51 OUL and 51 OUR, additional impurities 520 self-aligned to the exposed lateral edges of the spacers are forwarded into source/drain regions 530L and 530R, preferably through ion implantation. In an n-channel embodiment, ion implantation 520 preferably comprises the implantation of arsenic. In a p-channel embodiment, ion implantation 520 preferably comprises the implantation of boron. In both n-channel and p-channel embodiments, the peak concentration value of the source/drain impurity distribution may exceed approximately $10^{19}$ atoms/cm$^3$.

Figure 6:
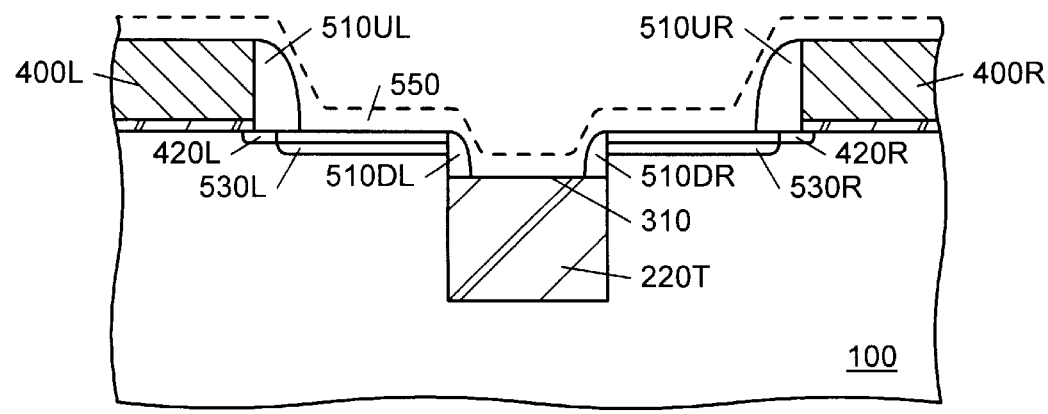
FIG. 6 is a partial cross-sectional view of a semiconductor topography according to a processing step subsequent to FIG. 5 in which protective sidewall spacers are formed upon the exposed trench sidewalls directly above the displaced trench dielectric surface.

FIG. 6 illustrates the formation of additional protective sidewall spacers 510DL and 510DR upon portions of the trench sidewalls disposed between the surface of substrate 100 and surface 310 of trench dielectric 220T. These portions of the trench sidewalls have been exposed as a result of the lowering of surface 310 of trench dielectric 220T, as detailed above. Sidewall spacers 510DL and 510DR are arranged upon the opposed trench sidewalls laterally adjacent to source/drain regions 530L and 530R. Spacers 510DL and 510DR are formed by depositing a dielectric layer 550 comprising, e.g., oxide, nitride, or oxynitride, across exposed surfaces of the semiconductor topography and anisotropically etching dielectric layer 550 more quickly from horizontal surfaces than vertical surfaces. The anisotropic etch process is terminated after dielectric layer 550 has been removed from all surfaces except the trench sidewalls, thereby forming sidewall spacers 510DL and 510DR.

Figure 7:
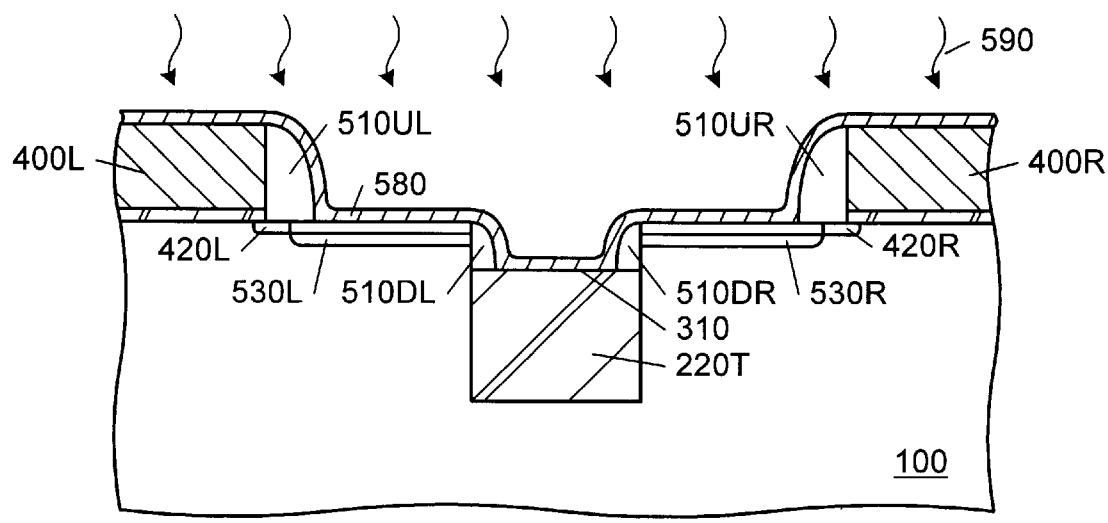
FIG. 7 is a partial cross-sectional view of a semiconductor topography according to a processing step subsequent to FIG. 6 in which a refractory metal layer is deposited across the semiconductor topography and heated to initiate reaction between the metal and adjacent silicon surfaces.
Figure 8:
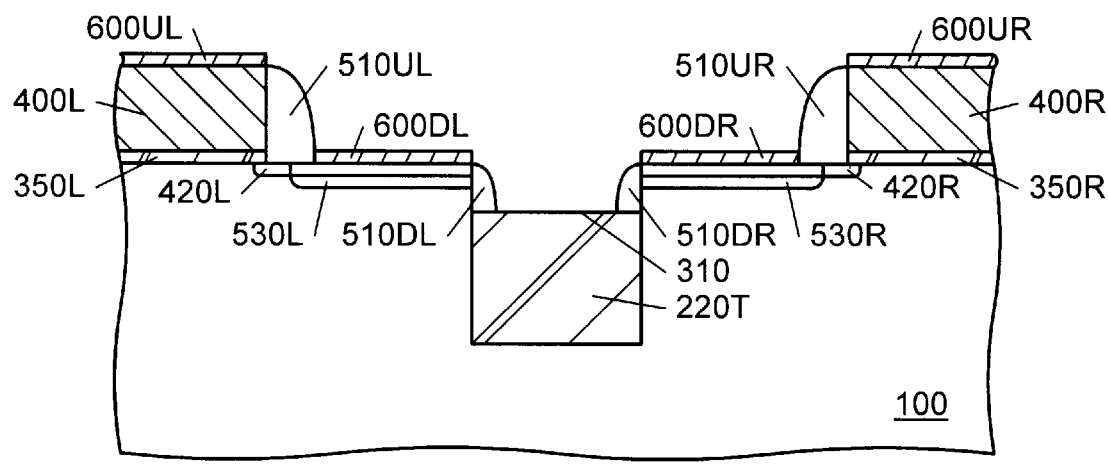
FIG. 8 is a partial cross-sectional view of a semiconductor topography according to a processing step subsequent to FIG. 7 in which silicide is formed upon the silicon embodied gate conductor and the source/drain junctions and unreacted refractory metal is removed.

Turning now to FIG. 7, a refractory metal 580, such as titanium, platinum, cobalt, molybdenum, tantalum, or tungsten, is deposited across the semiconductor topography using, e.g., sputter deposition from a metal target. Refractory metal 580 is then heated to by exposing the semiconductor topography to a form of radiation 590. Radiation 590 may be thermal radiation provided from a heated furnace or radiant light supplied from e.g., an arc lamp or a tungsten-halogen lamp using a technique known as rapid thermal processing ("RTP"). The use of RTP to heat refractory metal 590 may reduce the amount of contaminant diffusion into the semiconductor topography as compared to using a high temperature furnace. Raising the temperature of refractory metal 580 serves to initiate reaction between metal atoms and adjacent silicon atoms to form metal silicide. As shown in FIG. 8, silicide layers 600UL, 600UR, 600DL, and 600DR are therefore formed exclusively upon the surfaces comprising silicon, i.e., upon the surfaces of gate conductors 660UL and 600UR and those of S/D regions 530L and 530R. The unreacted refractory metal is removed by immersing the semiconductor topography in, e.g., a mixture of $H_2O$, $H_2O_2$, and $NH_4OH$. Silicide layers 600UL, 600UR, 600DL, and 600DR beneficially form low resistivity contact regions upon gate conductors 660UL and 600UR and S/D regions 530L and 530R. The presence of protective sidewall spacers 510DL and 510DR directly adjacent to the otherwise exposed portions of the trench sidewalls inhibits the refractory metal from contacting and reacting with silicon of substrate 100, and thereby prevents silicide formation upon the trench sidewalls.

Figure 9A:
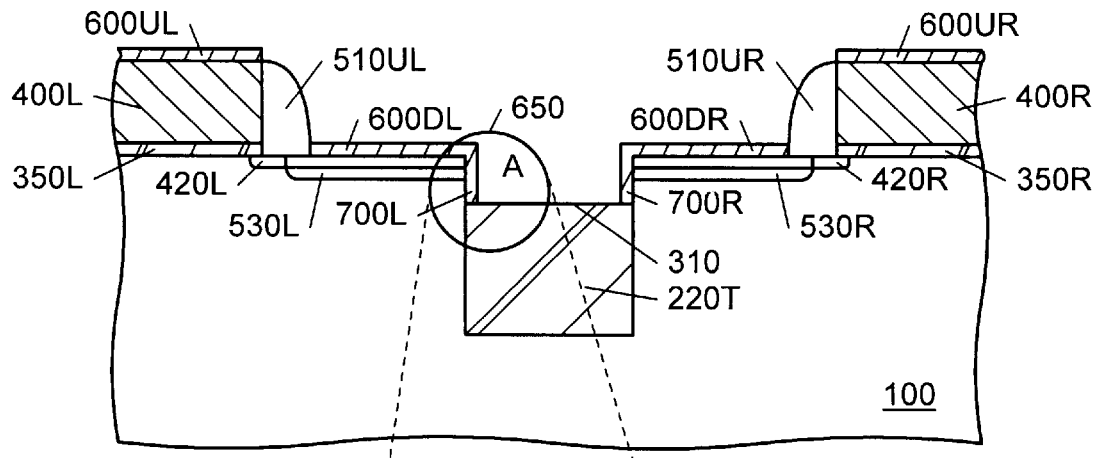
FIG. 9a is a partial cross-sectional view of a semiconductor topography with a shallow trench isolation structure and a transistor formed according to a conventional process absent protective sidewall spacers upon the exposed trench sidewalls.
Figure 9B:
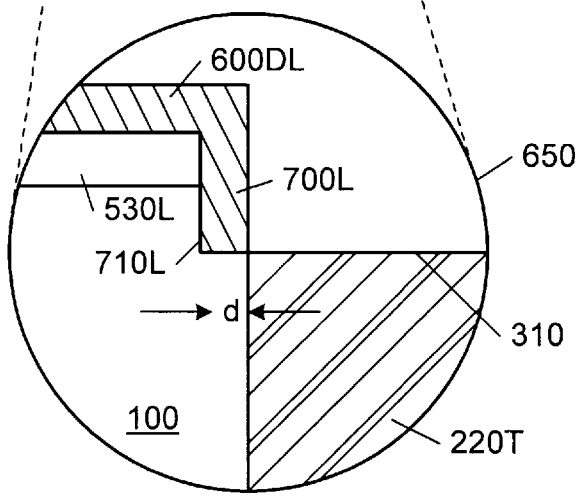
FIG. 9b is a detailed view along section 650 of FIG. 9a in which silicide is shown as being formed upon the exposed trench sidewalls absent protective sidewall spacers.

Turning now to FIGS. 9a and 9b, a semiconductor topography similar to that depicted in FIG. 8 is shown, absent protective sidewall spacers 510DL and 510DR. FIG. 9b is an expanded view along section 650 of FIG. 9a. FIGS. 9a and 9b show the harmful effects of not forming protective spacers 510DL and 510DR upon exposed portions of the trench sidewalls adjacent to source/drain regions 530L and 530R prior to silicide formation. Silicide layers 600 UL, 600 UR, 600DL, 600DR, 700L, and 700R are formed upon silicon-based surfaces of the semiconductor topography. Since no sidewall spacers exist upon the portions of the trench sidewalls disposed above trench dielectric 220T, refractory metal deposited upon these exposed portions is free to react with the silicon of substrate 100 to form silicide layers 700L and 700R. Consequently, silicide layers 700L and 700R form an electrical short between source/drain regions 530L and 530R. Thus, when a voltage is applied to silicide layers 600DL and 600DR, silicide layers 700L and 700R provide a conductive pathway between the source/drain regions and the underlying semiconductor substrate 100. As a result, the transistors formed upon substrate 100 may be rendered inoperable or may exhibit undesirable performance. Therefore, protective structures 510L and 510R (shown in FIG. 8) are critical for the proper operation of the transistors.

It will be appreciated to those skilled in the art having the benefit of this disclosure that this invention provides a method for forming protective sidewall spacers upon portions of trench sidewalls that become exposed during transistor and trench isolation structure formation, thereby reducing the chances of silicide forming upon the trench sidewalls. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. An isolation structure comprising:
   an isolation trench defined between a pair of trench sidewalls within a field region of a semiconductor substrate;
   a trench dielectric arranged within said trench, wherein an upper surface of said trench dielectric is recessed below an upper surface of said semiconductor substrate such that portions of said trench sidewalls are exposed; and
   protective sidewall spacers arranged upon said portions of the trench sidewalls, wherein said protective spacers are configured between the upper surface of said semiconductor substrate and the upper surface of said trench dielectric.

2. The isolation structure as recited in claim 1, wherein said semiconductor substrate comprises single-crystalline silicon doped n-type or p-type, and wherein a resistivity of said single-crystalline silicon is approximately 12 $\Omega$-cm.

3. The isolation structure as recited in claim 1, further comprising an active region of said semiconductor substrate laterally adjacent to said field region, wherein said active region comprises a transistor arranged upon and within said active region.

4. The isolation structure as recited in claim 3, wherein said transistor comprises:
   a gate dielectric arranged upon the upper surface of said semiconductor substrate a lateral spaced distance from said trench dielectric;
   a gate conductor arranged upon said gate dielectric and having a pair of opposed sidewall surfaces upon which dielectric spacers are arranged;
   lightly doped drain areas arranged within said active area directly underneath said dielectric spacers
   source/drain regions arranged within said active area laterally adjacent said lightly doped drain areas; and
   salicide layers arranged upon said conductive gate structure and said source/drain regions exclusive of said portions of the trench sidewalls.

5. The isolation structure as recited in claim 1, wherein said trench dielectric comprises TEOS deposited by CVD at a temperature of approximately 350°–650° C.

6. The isolation structure as recited in claim 1, wherein said protective sidewall spacers comprise a material selected from the group consisting of oxide, nitride, or oxynitride.

* * * * *